US009893240B2

(12) United States Patent
Chae et al.

(10) Patent No.: US 9,893,240 B2
(45) Date of Patent: Feb. 13, 2018

(54) LIGHT EMITTING DIODE AND LED MODULE HAVING THE SAME

(71) Applicant: Seoul Viosys Co., Ltd., Ansan-si (KR)

(72) Inventors: Jong Hyeon Chae, Ansan-si (KR); Won Young Roh, Ansan-si (KR); Joon Sup Lee, Ansan-si (KR); Min Woo Kang, Ansan-si (KR); Jong Min Jang, Ansan-si (KR); Hyun A Kim, Ansan-si (KR); Seon Min Bae, Ansan-si (KR); Daewoong Suh, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/041,461

(22) Filed: Feb. 11, 2016

(65) Prior Publication Data

US 2016/0163930 A1    Jun. 9, 2016

Related U.S. Application Data

(63) Continuation of application No. 14/495,771, filed on Sep. 24, 2014, now Pat. No. 9,343,627.

(30) Foreign Application Priority Data

Sep. 24, 2013  (KR) .................. 10-2013-0113296

(51) Int. Cl.
*H01L 33/46*   (2010.01)
*H01L 33/36*   (2010.01)
(Continued)

(52) U.S. Cl.
CPC ............. *H01L 33/46* (2013.01); *H01L 33/36* (2013.01); *H01L 33/44* (2013.01); *H01L 33/50* (2013.01);
(Continued)

(58) Field of Classification Search
CPC ......... H01L 33/36; H01L 33/44; H01L 33/08; H01L 33/46; H01L 2933/0016; H01L 33/405
See application file for complete search history.

(56) References Cited

U.S. PATENT DOCUMENTS

2008/0013329 A1   1/2008  Takeda
2009/0283787 A1*  11/2009  Donofrio ............... H01L 33/405
                                                     257/98

(Continued)

FOREIGN PATENT DOCUMENTS

EP        2492577        8/2012
JP       2012527116 A   11/2012
KR      1020130030178    3/2013

OTHER PUBLICATIONS

European Patent Office, European Patent Application No. 14797634.4, Extended European Search Report, dated Oct. 21, 2016, 10 pages.
Korean Intellectual Property Office, Notice of Office Action, Korean Application No. 10-2014-0123835, dated Mar. 13, 2015, 13 pages.

*Primary Examiner* — Tucker J Wright
(74) *Attorney, Agent, or Firm* — Perkins Coie LLP

(57) ABSTRACT

Disclosed are an LED and an LED module. The LED includes: a first conductivity type semiconductor layer; a mesa disposed over the first conductivity type semiconductor layer and including an active layer and a second conductivity type semiconductor layer; a first ohmic-contact structure in contact with the first conductivity type semiconductor layer; a second ohmic-contact structure in contact with the second conductivity type semiconductor layer; a lower insulating layer at least partially covering the mesa and the first conductivity type semiconductor layer and disposed to form a first opening part at least partially exposing the first ohmic-contact structure and a second opening part at least partially exposing the second ohmic- (Continued)

contact structure; and a current distributing layer connected to the first ohmic-contact structure at least partially exposed by the first opening part and disposed to form a third opening part at least partially exposing the second opening part.

19 Claims, 10 Drawing Sheets

(51) Int. Cl.
  *H01L 33/44* (2010.01)
  *H01L 33/50* (2010.01)
  *H01L 33/62* (2010.01)
  *H01L 33/08* (2010.01)
(52) U.S. Cl.
  CPC .............. *H01L 33/62* (2013.01); *H01L 33/08* (2013.01); *H01L 2224/11* (2013.01); *H01L 2933/0016* (2013.01)

(56) References Cited

U.S. PATENT DOCUMENTS

| | | | |
|---|---|---|---|
| 2011/0014734 A1* | 1/2011 | Lu | H01L 33/44 438/29 |
| 2012/0007129 A1* | 1/2012 | Beom | H01L 33/38 257/98 |
| 2013/0032820 A1 | 2/2013 | Wirth | |

\* cited by examiner

LIGHT EMITTING DIODE AND LED MODULE HAVING THE SAME

CROSS-REFERENCE TO RELATED APPLICATIONS

This patent document is a continuation of, and claims the benefits of and priority to, U.S. patent application Ser. No. 14/495,771, filed on Sep. 24, 2014, which claims the benefits of and priority to Korean Patent Application No. 10-2013-0113296, filed on Sep. 24, 2013, which are all hereby incorporated by reference in their entirety.

BACKGROUND

Exemplary embodiments of this patent document relates to a light emitting diode (LED) and an LED module including a light emitting diode which can be adhered onto a printed circuit board, or the like by a solder paste, and an LED module having the same.

Since a gallium nitride (GaN) based light emitting diode (LED) has been developed, the GaN based LED has been currently used for various applications such as a natural color LED display element, an LED traffic signal, a white color LED, and the like.

The above information disclosed in this Background section is only for enhancement of understanding of the background of the invention and, therefore, it may contain information that does not constitute prior art.

SUMMARY

Exemplary embodiments of the patent document is to provide or can include providing a light emitting diode (LED) and an LED module capable of improving current distributing performance while also decreasing light loss.

Exemplary embodiments of the patent document is to provide or can include providing a light emitting diode (LED) module having an LED which is adhered onto a printed circuit board by solder paste.

Exemplary embodiments of the patent document is to provide or can include providing a light emitting diode (LED) and an LED module capable of preventing diffusion of metallic elements in a solder paste.

Additional features of the patent document will be set forth in the description which follows, and in part will become apparent from the description, or can be learned from practicing techniques, systems and devices disclosed in the patent document.

An exemplary embodiment of the patent document discloses a light emitting diode including: a first conductivity type semiconductor layer; a mesa disposed over the first conductivity type semiconductor layer and including an active layer and a second conductivity type semiconductor layer; a first ohmic-contact structure in contact with the first conductivity type semiconductor layer; a second ohmic-contact structure in contact with the second conductivity type semiconductor layer of the mesa; a lower insulating layer covering the mesa and the first conductivity type semiconductor layer, the lower insulating layer disposed to form a first opening part at least partially exposing the first ohmic-contact structure and a second opening part at least partially exposing the second ohmic-contact structure; and a current distributing layer disposed over the lower insulating layer and electrically connected to the first ohmic-contact structure at least partially exposed by the first opening part of the lower insulating layer, the current distributing layer disposed to form a third opening part at least partially exposing the second opening part.

The light emitting diode can be implemented in various ways to include one or more of the following features. The first ohmic-contact structure is formed to be separated from the current distributing layer, such that the range of choice of the metal material of the current distributing layer is increased to improve light reflectivity of the current distributing layer.

The light emitting diode can include first ohmic-contact structures. The current distributing layer can electrically connect the first ohmic-contact structures to each other.

Since the first ohmic-contact structures are electrically connected to each other using the current distributing layer, a current can be easily distributed into the first ohmic-contact structures to improve current distributing performance of the light emitting diode. Since the current distributing layer can be formed across a wide area of the light emitting diode, resistance of the current distributing layer can be reduced.

The current distributing layer can have a stacked structure different from the first ohmic-contact structure and can include a metal reflective layer. The metal reflective layer can be a lowest layer in the stacked structure of the current distributing layer. Light emitted through a side surface of the mesa is directly reflected from the metal reflective layer, and as a result, light loss due to the current distributing layer can be reduced.

Further, the light emitting diode can include a diffusion preventing reinforced layer disposed in a third opening part of the current distributing layer and connected to the second ohmic-contact structure which is at least partially exposed by the second opening part. The diffusion preventing reinforced layer can have the same stacked structure as the current distributing layer. It is possible to prevent a metal such as Sn from being diffused into the second ohmic-contact structure by adopting the diffusion preventing reinforced layer.

The light emitting diode can include mesas and second ohmic-contact structures connected to the second conductivity type semiconductor layers on the respective mesas. The diffusion preventing reinforced layer can electrically connect the second ohmic-contact structures to each other.

Further, the light emitting diode can include an upper insulating layer covering the current distributing layer. The upper insulating layer can be disposed for form a fourth opening part defining a first electrode pad region by exposing the current distributing layer and a fifth opening part defining a second electrode pad region by at least partially exposing an upper region of the second ohmic-contact structure.

The light emitting diode can include a diffusion preventing reinforced layer disposed in the third opening part of the current distributing layer and connected to the second ohmic-contact structure which is at least partially exposed by the second opening part, and the diffusion preventing reinforced layer can be at least partially exposed to the fifth opening part.

The current distributing layer and the diffusion preventing reinforced layer can have the same structure and include a metal reflective layer.

The current distributing layer can include the metal reflective layer, a diffusion preventing layer, and an oxide preventing layer. Light generated from the active layer can be reflected by the current distributing layer and the diffusion preventing reinforced layer and diffusion of Sn, or the like can be prevented, such that the light emitting diode can be mounted on the printed circuit board, or the like using the solder paste.

The current distributing layer can further include an adhesive layer disposed over the oxide preventing layer. The adhesive layer improves adhesion of the upper insulating layer which is disposed over the current distributing layer and the current distributing layer.

According to another exemplary embodiment, there is provided a light emitting diode module including a printed circuit board; and a light emitting diode adhered onto the printed circuit board. The light emitting diode can be any light emitting diode as described above, and can be adhered onto the printed circuit board by a solder paste.

The light emitting diode module can be implemented in various ways to include one or more of the following features. The light emitting diode can include: a first conductivity type semiconductor layer; a mesa disposed over the first conductivity type semiconductor layer and including an active layer and a second conductivity type semiconductor layer; a first ohmic-contact structure being in contact with the first conductivity type semiconductor layer, a second ohmic-contact structure being in contact with the second conductivity type semiconductor layer of the mesa; a lower insulating layer covering the mesa and the first conductivity type semiconductor layer and disposed to form a first opening part at least partially exposing the first ohmic-contact structure and a second opening part at least partially exposing the second ohmic-contact structure; a current distributing layer connected to the first ohmic-contact structure t least partially exposed by the first opening part of the lower insulating layer and having a third opening part at least partially exposing the second opening part; and an upper insulating layer covering the current distributing layer. The upper insulating layer can be disposed to form a fourth opening part defining a first electrode pad region by at least partially exposing the current distributing layer and a fifth opening part defining a second electrode pad region by at least partially exposing an upper region of the second ohmic-contact structure which is at least partially exposed by the second opening part; and the first electrode pad region and the second electrode pad region can be respectively adhered to the corresponding pads on the printed circuit board by the solder paste.

According to still another exemplary embodiment, there is provided a method of manufacturing a light emitting diode, the method including: forming a first conductivity type semiconductor layer, an active layer, and a second conductivity type semiconductor layer over a substrate; forming a mesa over the first conductivity type semiconductor layer by patterning the second conductivity type semiconductor layer and the active layer; forming a first ohmic-contact structure contacting the first conductivity type semiconductor layer and a second ohmic-contact structure contacting the second conductivity type semiconductor layer; forming a lower insulating layer which covers the mesa and the first conductivity type semiconductor layer and disposed to form a first opening part at least partially exposing the first ohmic-contact structure and a second opening part at least partially exposing the second ohmic-contact structure; and forming a current distributing layer which is connected to the first ohmic-contact structure, on the lower insulating layer. The current distributing layer can be disposed to form a third opening part at least partially exposing the second opening part.

Since the first ohmic-contact structure and the current distributing layer are formed in separate processes, there is no need to form a lowest layer of the current distributing layer using an ohmic metal, making it possible to reduce light loss due to the current distributing layer.

The method can be implemented in various ways to include one or more of the following features. The method can include, during the forming of the current distributing layer, forming a diffusion preventing reinforced layer disposed in the third opening part. The diffusion preventing reinforced layer can be formed of the same material and in the same process as the current distributing layer, and as a result, the diffusion preventing reinforced layer can have the same stacked structure as the current distributing layer.

The method can include forming an upper insulating layer covering the current distributing layer and the upper insulating layer can be disposed to form a fourth opening part at least partially exposing the current distributing layer and a fifth opening part at least partially exposing the diffusion preventing reinforced layer.

The current distributing layer and the diffusion preventing reinforced layer which are at least partially exposed by the fourth opening part and the fifth opening part can be respectively used as electrode pads.

BRIEF DESCRIPTION OF THE DRAWINGS

FIG. 9A is a perspective view, FIG. 9B is a cross-sectional view taken along a dash line A-A, FIG. 9C is a cross-sectional view taken along a dash line B-B, and FIG. 9D is a cross-sectional view taken along a dash line C-C.

DETAILED DESCRIPTION OF THE ILLUSTRATED EMBODIMENTS

Figure 1:
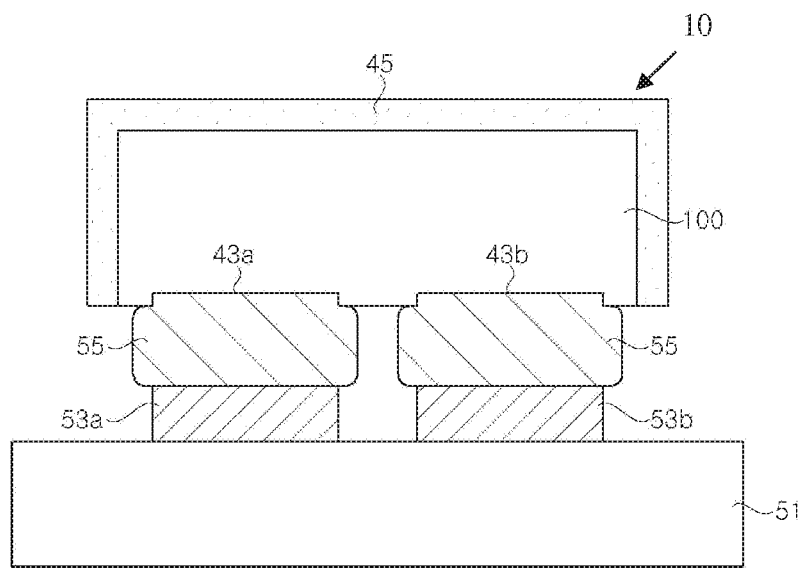
FIG. 1 is a schematic cross-sectional view for describing an exemplary light emitting diode (LED) module according to an exemplary embodiment of the patent document.

Hereinafter, exemplary embodiments of the patent document will be described in detail with reference to the accompanying drawings. The exemplary embodiments of the patent documents to be described below are provided by way of example so that the idea of the patent document can be sufficiently transferred to those skilled in the art to which the patent document pertains. Therefore, the patent document is not limited to exemplary embodiments described below, but can be implemented in other forms. In the accompanying drawings, widths, lengths, thicknesses, or the like, of components can be exaggerated for convenience. Like reference numerals denote like elements throughout the specification.

A GaN based LED is generally formed by depositing an epitaxial layer on a substrate made of sapphire, and includes an N-type semiconductor layer, a P-type semiconductor layer, and an active layer interposed between the N- and P-type semiconductor layers. An N-electrode pad is formed on or disposed over the N-type semiconductor layer and a P-electrode pad is formed on or disposed over the P-type semiconductor layer. The LED is electrically connected to an external power source through the electrode pads and is driven by the external power source. In this case, a current flows from the P-electrode pad to the N-electrode pad via the semiconductor layers.

In order to prevent light loss due to the p-electrode pad and increase heat dissipating efficiency, an LED having a flip-chip structure can been used, and various electrode structures to assist in current distribution in the LED having a large scale flip-chip structure can be implemented (see, for example, U.S. Pat. No. 6,486,499). For example, extensions for current distribution can be formed on or disposed over the N-type semiconductor layer which is exposed by forming a reflective electrode on the P-type semiconductor layer and etching the P-type semiconductor layer and the active layer.

The reflective electrode formed on or disposed over the P-type semiconductor layer can improve light emission efficiency by reflecting light generated from the active layer and also assisting in the current distribution within the P-type semiconductor layer. The extensions connected to the N-type semiconductor layer can assist in the current distribution within the N-type semiconductor layer to allow light to be uniformly generated in a wide active region. In a large-scale LED having an area of about 1 mm$^2$ or more which is used for a high output, current distribution within the N-type semiconductor layer together with the current distribution with the P-type semiconductor layer tend to be required.

However, there can be a limit in distributing the current due to the use of linear extensions increasing the resistance of the extensions. Further, since the reflective electrode is restrictively disposed on the P-type semiconductor layer, a significant amount of light is not reflected by the reflective electrode and is lost by the pads and the extensions.

In accordance with Korean Patent Laid Open Publication No. 10-2013-0030178, for example, a current distributing layer that covers mesas and makes ohmic-contact with the N-type semiconductor layer can be adopted, such that the resistances of the extensions are decreased. Further, the current distributing layer can include a metal reflective layer to decrease light loss.

However, since the current distributing layer includes an ohmic-contact layer and the metal reflective layer, light reflectivity of the current distributing layer can be low.

When the LED is used in a final product, it is or can be modularized into an LED module. The LED module generally includes a printed circuit board (PCB) and an LED package mounted on the PCB, and the LED is mounted in a chip form in the LED package. An LED chip according to the related art is mounted and packaged on a sub-mount, a lead frame, a lead electrode, or the like using silver paste or AuSn solder, and the LED package is then mounted on the PCB, or the like by solder paste. Accordingly, the pads on the LED chip are positioned to be far away from the solder paste and are adhered using an adhering material such as silver paste, AuSn, or the like which is relatively stable.

However, the pads of the LED can be directly adhered to the PCB, or the like using the solder paste to manufacture the LED module. The LED module can be manufactured by directly mounting the LED chip on the PCB without packaging the LED chip, or the LED module can be manufactured by manufacturing the LED package of a so-called wafer level and mounting the package on the PCB. In these cases, since the pads are directly in contact with the solder paste, metallic elements such as tin (Sn), and the like in the solder paste are diffused into the LED through the pads, such that electrical short occurs in the LED and a device defect can be caused.

FIG. 1 is a schematic cross-sectional view for describing an exemplary light emitting diode (LED) module according to an exemplary embodiment of the patent document.

Referring to FIG. 1, a light emitting diode (LED) module 10 includes a printed circuit board 51 having pads 53a and 53b, and a light emitting diode 100 which is adhered to the printed circuit board 51 by a solder paste 55. In the example shown in FIG. 1, the solder paste 55 is used to connect the LED 100 to the pads 53a and 53b of the printed circuit board 51.

The printed circuit board 51, which is a board having a printed circuit formed on the board, is not particularly or in any way limited as long as the printed circuit board is structured for providing a light emitting module.

For indirect mounting, a package is fabricated by mounting a light emitting diode on a printed circuit board on which a lead frame or lead electrodes are formed, and the package having the light emitting diode mounted is mounted on the printed circuit board. However, according to the present exemplary embodiment, the light emitting diode 100 is directly mounted on the printed circuit board 51 by the solder paste 55 without using a separate light emitting diode package.

The light emitting diode 100 is reversed or flipped over in a flip-chip form and is mounted on the printed circuit board 51. The light emitting diode 100 has a first electrode pad region 43a and a second electrode pad region 43b so as to be mounted on the printed circuit board 51. The above-mentioned first and second electrode pad regions 43a and 43b can be disposed to be recessed into one surface of the light emitting diode 100 to form respective recessed areas for receiving the solder paste 55.

A lower surface, which faces up after flipping over the LED 100, of the light emitting diode 100, that is, a surface opposite to the first and second electrode pad regions 43a and 43b can be covered with a wavelength converter 45. The wavelength converter 45 can cover a side surface or surfaces substantially perpendicular to the lower surface in addition to the lower surface of the light emitting diode 100.

Although FIG. 1 is schematically shown for convenience of explanation, a structure and the respective components of the light emitting diode 100 will be more clearly understood by a method of manufacturing a light emitting diode which is described below.

FIGS. 2A, 2B, 3A, 3B, 4A, 4B, 5A, 5B, 6A, 6B, 6C, 7A, 7B, 7C, 8A, 8B, 8C, 9A, 9B, 9C and 9D are various views for describing an exemplary method of manufacturing a light emitting diode (LED) and an LED module according to an exemplary embodiment of the patent document. In the respective figures of FIGS. 2A, 2B, 3A, 3B, 4A, 4B, 5A, 5B, 6A, 6B, 6C, 7A, 7B, 7C, 8A, 8B, and 8C, (A) shows a plan view, (B) shows a cross-sectional view taken along a dash line A-A, and (C) shows a cross-sectional view taken along a dash line B-B. FIG. 9A is a perspective view, FIG. 9B is a cross-sectional view taken along a dash line A-A, FIG. 9C is a cross-sectional view taken along a dash line B-B, and FIG. 9D is a cross-sectional view taken along a dash line C-C.

Figure 2A:
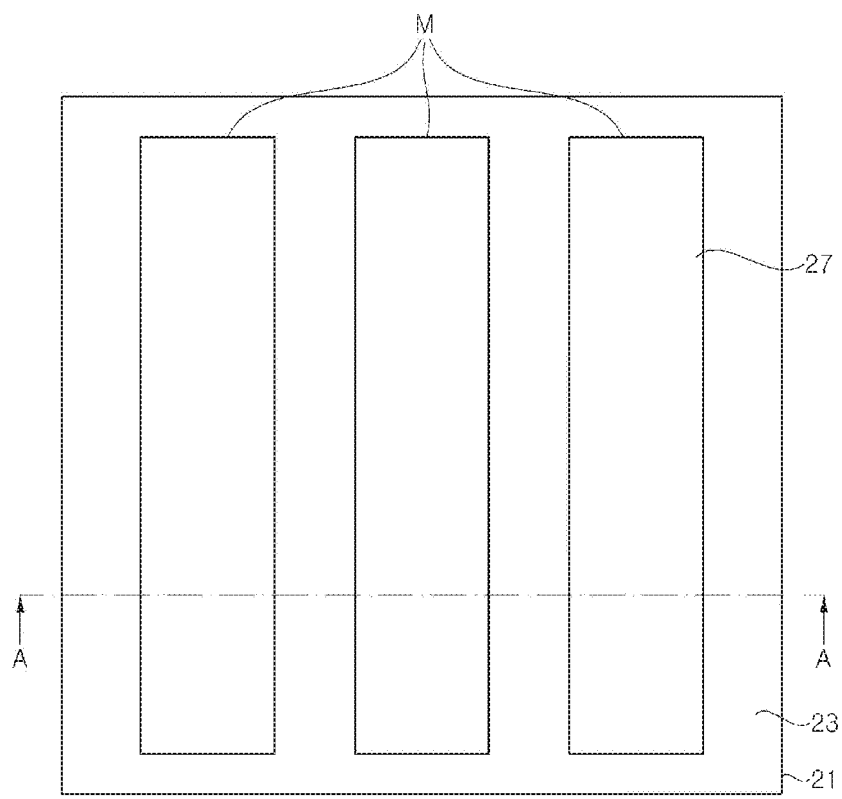
FIGS. 2A, 2B, 3A, 3B, 4A, 4B, 5A, 5B, 6A, 6B, 6C, 7A, 7B, 7C, 8A, 8B, 8C, 9A, 9B, 9C, and 9D are various views for describing an exemplary method of manufacturing a light emitting diode (LED) and an LED module according to an exemplary embodiment of the patent document. In the respective figures of FIGS. 2A through 8C, (A) shows a plan or top-down view, (B) shows a cross-sectional view taken along a dash line A-A, and (C) shows a cross-sectional view taken along a dash line B-B.
Figure 2B:
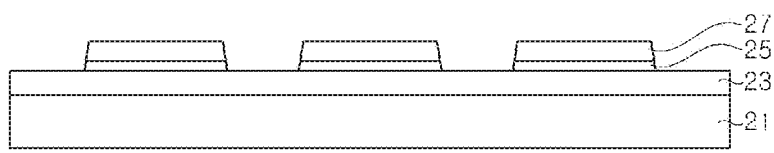

First, referring to FIGS. 2A and 2B, a first conductivity type semiconductor layer 23 is formed on or disposed over a substrate 21, and mesas M which are spaced apart from each other are formed on or disposed over the first conductivity type semiconductor layer 23. Each of the mesas M respectively include an active layer 25 and a second conductivity type semiconductor layer 27 disposed over the active layer 25. Although FIGS. 2A and 2B of the present specification shows and describes a case in which three mesas M are formed to be spaced apart from each other, the total number of mesas M used can vary. For example, more than three mesas M can be formed and one or two mesas M can be formed.

The mesas M can be formed by depositing an epitaxial layer including the first conductivity type semiconductor layer 23, the active layer 25, and the second conductivity type semiconductor layer 27 on the substrate 21 using a metal organic chemical vapor deposition method, or the like and then patterning the second conductivity type semiconductor layer 27 and the active layer 25 so that the first conductivity type semiconductor layer 23 is exposed at areas bordering the mesas M at all sides. For example, mesas M are formed by using etching to remove a portion of the first conductivity type semiconductor layer 23, the active layer 25, and the second conductivity type semiconductor layer 27. The exposed areas of the first semiconductor layer 23 is substantially free of the second conductivity type semiconductor layer 27 and the active layer 25. Side surfaces of the mesas M can be formed to be inclined from the active layer 25 towards the second conductivity type semiconductor layer 27 by using an appropriate technology such as photoresist reflow. An inclined profile of the side surface of the mesas M improves or can potentially improve extraction efficiency of light generated from the active layer 25.

The substrate 21, which is a board capable of receiving a deposition of gallium nitride based semiconductor layer, can be, for example, a sapphire-based printed circuit board, a silicon carbide-based printed circuit board, a gallium nitride (GaN)-based printed circuit board, a spinel-based printed circuit board, or the like. For example, the substrate 21 can be a patterned printed circuit board such as a patterned sapphire-based printed circuit board.

For example, the first conductivity type semiconductor layer 23 can include an n-type gallium nitride based layer and the second conductive semiconductor layer 27 includes or can include a p-type gallium nitride based layer. In addition, the active layer 25 can have a single quantum well structure or a multiple quantum well structure, and can include a well layer and a barrier layer. In addition, for the well layer, a composition element can be selected depending on a required wavelength of light and can include, for example, AlGaN, GaN, or InGaN. Depending on a composition element of the active layer 25, the light emitting diode 100 becomes or can become a light emitting diode emitting visible light or a light emitting diode emitting ultraviolet.

As shown in FIGS. 2A and 2B, in the case in which the mesas M are formed on or disposed over the first conducive type semiconductor layer 23, the mesas M can be extended in parallel with each other in one side direction while having an elongated shape. As described above, mesas M are formed by using etching to remove a portion of the first conductivity type semiconductor layer 23, the active layer 25, and the second conductivity type semiconductor layer 27. This elongated shape simplifies a process of forming the mesas M having the same shape in various chip regions on the substrate 21.

Figure 3A:
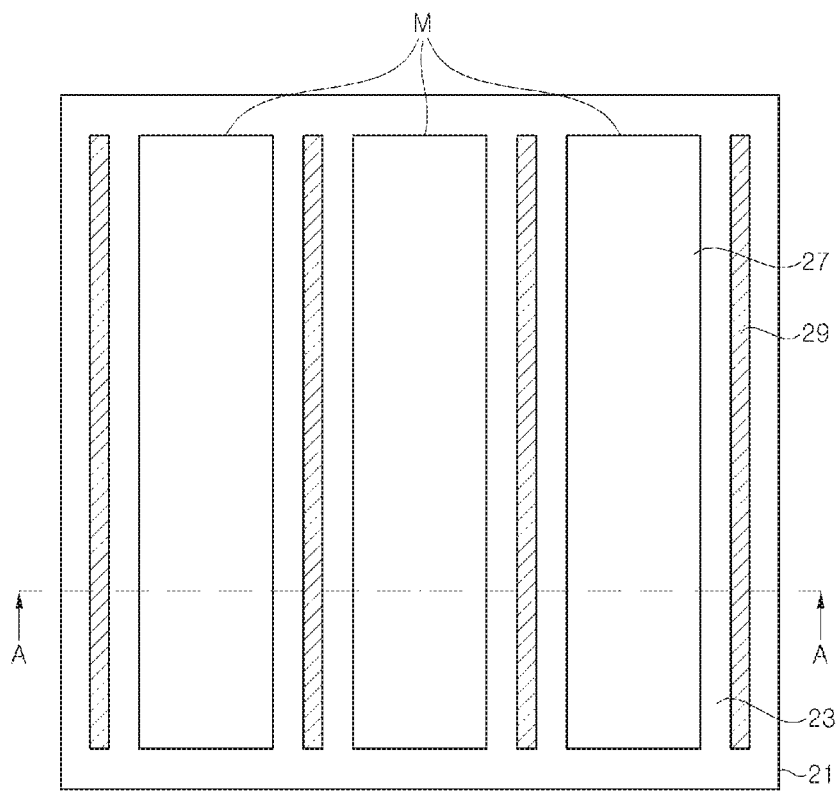
Figure 3B:
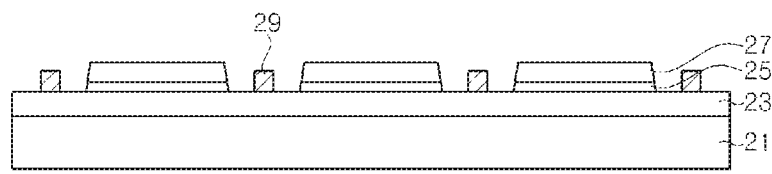

Referring to FIGS. 3A and 3B, a first ohmic-contact structure 29 is formed on or disposed over the first conductivity type semiconductor layer 23 at areas exposed by mesa etching. For example, the first ohmic-contact structure 29 can be formed or disposed between the mesas M and edges along a length direction of the mesas M. As shown in FIG. 3, multiple ones of the first ohmic-contact structure 29 and the mesas M are disposed over the first conductivity type semiconductor layer 23 in an alternative fashion. The first ohmic-contact structure 29 is formed of or includes a material which is in ohmic-contact with the first conductivity type semiconductor layer 23, and can include, for example, titanium/aluminum (Ti/Al). In case of an ultraviolet light emitting diode, the first ohmic-contact structure can have a stacked structure of Ti/Al/Ti/Au.

Although the present exemplary embodiment of FIGS. 3A and 3B shows and describes a case in which multiple ones of the first ohmic-contact structures 29 are formed to be spaced apart from each other, a single one of the first ohmic-contact structure 29 in which the multiple ones of the first ohmic-contact structures 29 are connected to each other can be formed on or disposed over the first conductivity type semiconductor layer 23.

Figure 4A:
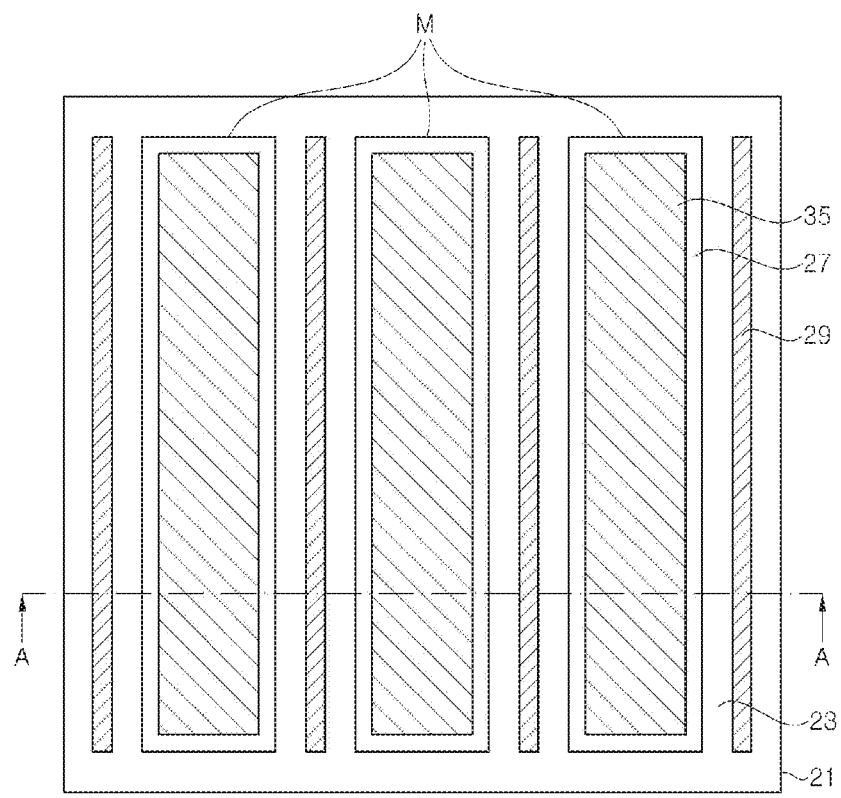
Figure 4B:
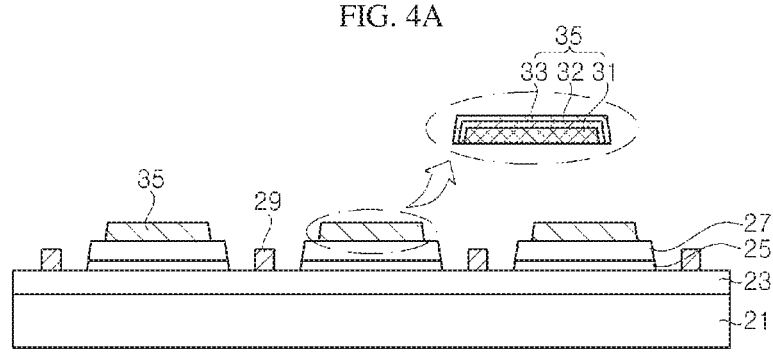

Referring to FIGS. 4A and 4B, a second ohmic-contact structure 35 is formed on or disposed over each of the mesas M. The second ohmic-contact structure 35 can be formed using a lift-off technology, for example. The second ohmic-contact structure 35 is formed on or disposed over each mesa M and has a shape which is substantially similar to that of the mesa M. The second ohmic-contact structure 35 having the same structure as the corresponding mesa M can have a total surface area smaller than or substantially similar to the total surface area of the corresponding mesa M.

The second ohmic-contact structure 35 can have different structures depending on or at least partially on a kind of light emitting diode implemented. For example, for a light emitting diode emitting ultraviolet light of an ultraviolet-B (UVB) region and an ultraviolet-A (UVA) region which is close to the UVB region, the second ohmic-contact structure 35 can include Ni/Au or Ni/Au and an adhesive layer.

In case of a blue light emitting diode or an ultraviolet light emitting diode of the UVA region which is close to a blue light, the second ohmic-contact structure 35 can include a reflective metal part 31, a capping metal part 32, and an oxide preventing metal part 33. The reflective metal part 31 can include at least one of an ohmic layer, a reflective layer, or a stress alleviation layer disposed between the reflective metal part 31 and the capping metal part 32. The stress alleviation layer alleviates or substantially alleviates the stress generated due to a difference between coefficients of thermal expansion of the reflective metal part 31 and the capping metal part 32.

The reflective metal part 31 can be formed of or include, for example, Ni/Ag/Ni/Au, and can have a total thickness of about 1600 angstrom (Å). The reflective metal part 31 is formed or disposed so that a side surface is inclined as shown, that is, a bottom part has a relatively wider shape. The above-mentioned reflective metal part 31 can be formed by forming a photoresist pattern having opening parts exposing the mesas M and then using e-beam evaporation.

The capping metal part 32 covers or can cover an upper surface and a side surface or surfaces of the reflective metal part 31 to protect the reflective metal part 31. The capping metal part 32 can be formed by using a sputtering technology or using e-beam evaporation (e.g., planetary e-beam evaporation) tilting, rotating, and vacuum-depositing the board 21. The capping metal part 32 can include Ni, Pt, Ti, or Cr, and can be formed by depositing, for example, about five pairs of Ni/Pt or about five pairs of Ni/Ti. In some implementations, the capping metal part 32 can include TiW, W, or Mo.

The stress alleviation layer can be variously selected depending on metal materials of the reflective layer and the capping metal part 32. For example, in the case in which the reflective layer is or includes Al or an Al alloy and the capping metal part or layer 32 includes W, TiW, or Mo, the stress alleviation layer can be or include a single layer of Ag, Cu, Ni, Pt, Ti, Rh, Pd, or Cr, or can be or include a composite layer of Cu, Ni, Pt, Ti, Rh, Pd, or Au. In addition, in the case in which the reflective layer is or includes Al or an Al alloy and the capping metal part 32 is or includes Cr, Pt, Rh, Pd, or Ni, the stress alleviation layer can be or includes a single layer of Ag, or Cu, or can be or include a composite layer of Ni, Au, Cu, or Ag.

In addition, in the case in which the reflective layer is Ag or an Ag alloy and the capping metal part 32 includes W, TiW, or Mo, the stress alleviation layer can be or includes a single layer of Cu, Ni, Pt, Ti, Rh, Pd, or Cr, or can be or include a composite layer of Cu, Ni, Pt, Ti, Rh, Pd, Cr, or Au. In addition, in the case in which the reflective layer is Ag or an Ag alloy and the capping metal part 32 is Cr or Ni, the stress alleviation layer can be or include a single layer of Cu, Cr, Rh, Pd, TiW, or Ti, or can be or include a composite layer of Ni, Au, or Cu.

In addition, an oxidation preventing metal part 33 includes Au in order to prevent oxidation of the capping metal part 32, and can be formed of or include, for example, Au/Ni or Au/Ti. Ti is an effective choice since Ti has good adhesion with an oxidation layer such as $SiO_2$. The oxidation preventing metal part 33 can be formed by using a sputtering or using e-beam evaporation (e.g., planetary e-beam evaporation) tilting, rotating, and vacuum-depositing the substrate 21.

The second ohmic-contact structure 35 is deposited and the photoresist pattern is then removed, such that the second ohmic-contact structure 35 is left on the second conductivity type semiconductor layer 27 as shown in FIGS. 4A and 4B.

Although the present exemplary embodiment as shown in FIGS. 4A and 4B describes a case in which the mesas M, the multiple ones of the first ohmic-contact structure 29, and the second ohmic-contact structure 35 are formed in sequence, an order of forming these components can be varied. For example, the second ohmic-contact structure 35 can be formed before the first ohmic-contact structure 29 is formed, and can also be formed before the mesa M is formed.

Figure 5A:
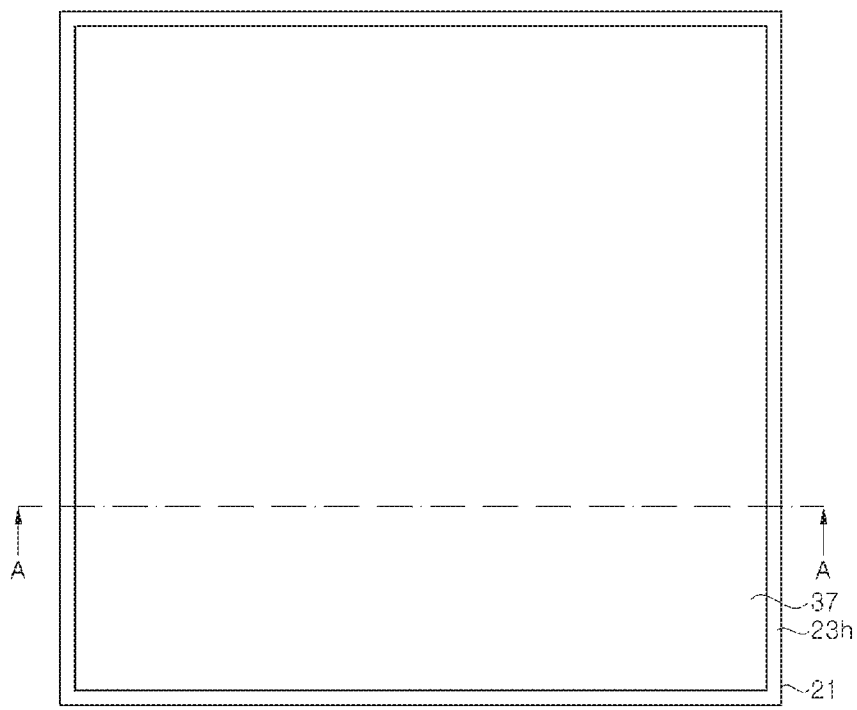
Figure 5B:
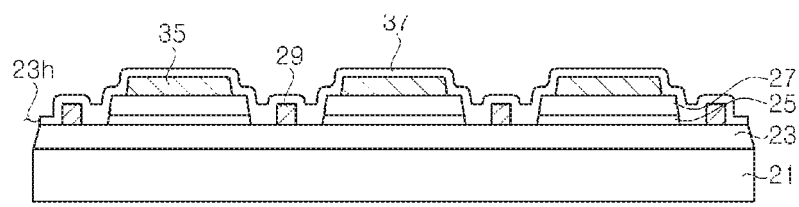

Referring to FIGS. 5A and 5B, after the first and second ohmic-contact structures are formed, a lower insulating layer 37 is formed to cover the mesas M and the first conductivity type semiconductor layer 23. The lower insulating layer 37 can be formed by an oxide film such as $SiO_2$, or the like, a nitride film such as SiNx, or the like, and an insulating film such as $MgF_2$, or the like using a technology such as chemical vapor deposition, or the like. The lower insulating layer 37 can be formed to have a thickness of, for example, 4000 to 12000 Å. The lower insulating layer 37 can be formed by a single layer, but is not limited to a single layer. For example, the lower insulating layer 37 can be formed by a multi-layer. Further, the lower insulating layer 37 can be formed by a distributed Bragg reflector (DBR) in which a low refractive index material layer and a high refractive index material layer are alternately stacked. For example, an insulating reflective layer having high reflectivity can be formed by stacking a layer such as $SiO_2/TiO_2$, $SiO_2/Nb_2O_5$, or the like.

A dividing region 23h dividing the lower insulating layer 37 and the first conductivity type semiconductor layer 23 into a chip unit can be formed using a laser scribing technology. A groove can also be formed in an upper surface (e.g. the surface in contact with the first conductivity type semiconductor layer 23) of the substrate 21 by the laser scribing. As a result, the substrate 21 is exposed in the vicinity of edges of the first conductivity type semiconductor layer 23.

Since the first conductivity type semiconductor layer 23 is divided into the chip unit using the laser scribing technology, a separate photomask is not used.

Although the present exemplary embodiment shows a case in which the lower insulating layer 37 and the first conductivity type semiconductor layer 23 are divided into the chip unit using the laser scribing technology after the lower insulating layer 37 is formed, the first conductivity type semiconductor layer 23 can be divided into the chip unit using the laser scribing technology before the lower insulating layer 37 is formed.

Figure 6A:
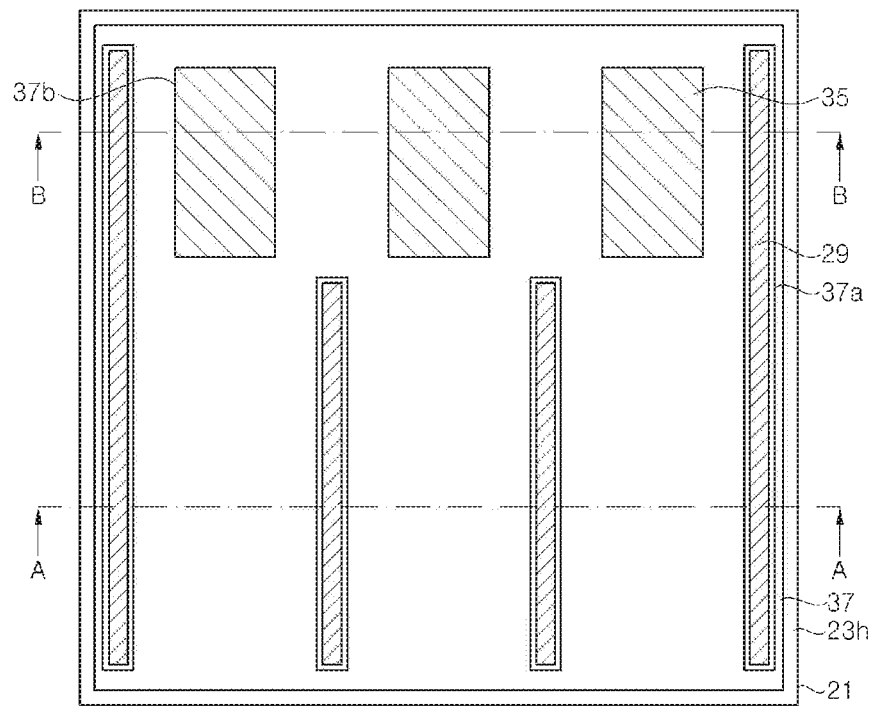
Figure 6B:
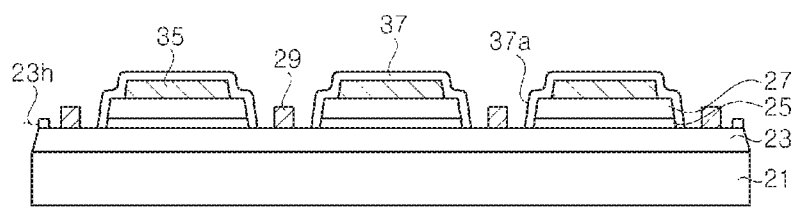
Figure 6C:
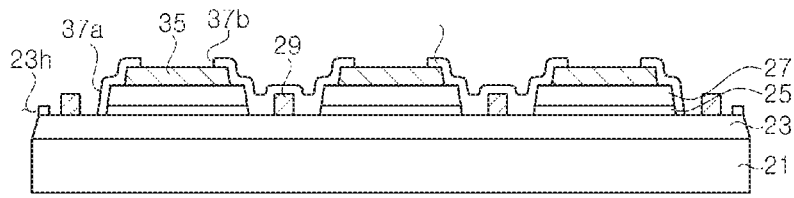

Referring to FIGS. 6A, 6B and 6C, by patterning the lower insulating layer 37, first opening parts 37a exposing or partially exposing the first ohmic-contact structures 29 are formed, and second opening parts 37b exposing or partially exposing the second ohmic-contact structures 35 are formed.

As shown in FIG. 6A, the second opening parts 37b can be formed on or disposed over the respective mesas M in a state which is leaned to an edge of one side of the substrate 21 to expose a portion of the respective mesas M. In addition, the first ohmic-contact structures 29 disposed between the second opening parts 37b are covered or partially covered with the lower insulating layer 37 as shown in FIGS. 6B and 6C.

The subset of the first ohmic-contact structures 29 which are disposed at the edges of the board 21 among the first ohmic-contact structures 29 can be fully exposed by the first opening parts 37a. However, in case of the first ohmic-contact structures 29 which are disposed between the mesas M, in order to prevent the first ohmic-contact structure 29 and the second ohmic-contact structure 35 from being short-circuited in a subsequent process, the regions of the first ohmic-contact structure 29 exposed by the first opening parts 37a are disposed to be spaced apart from regions between the second opening parts 37b. The locations of the first opening parts 37a and second opening parts 37b are arranged to avoid overlapping along the same lateral line.

Figure 7A:
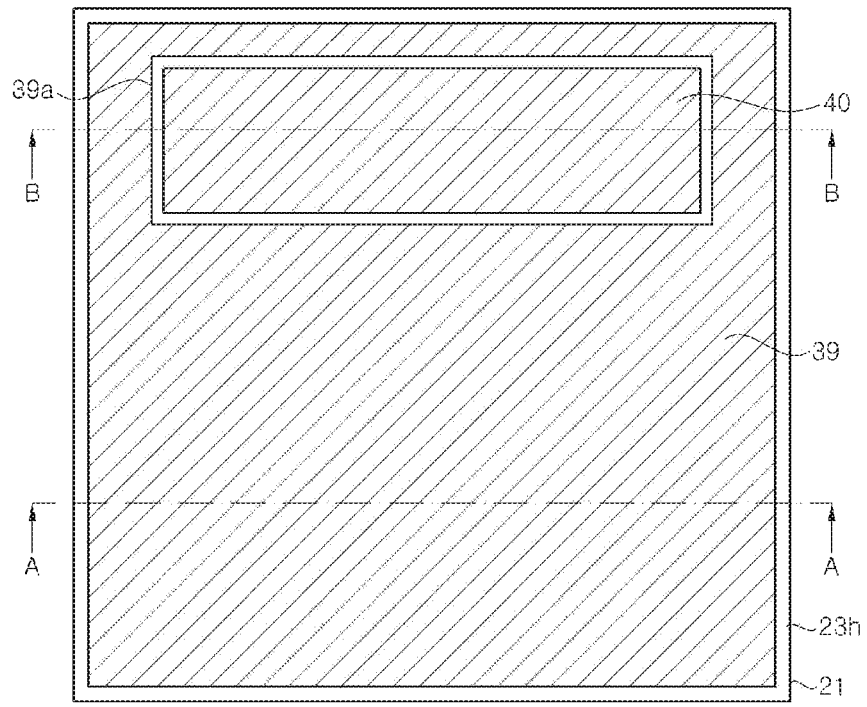
Figure 7B:
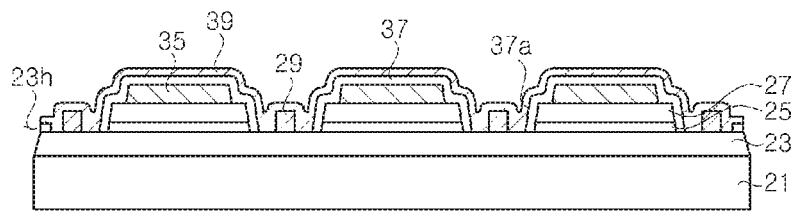
Figure 7C:
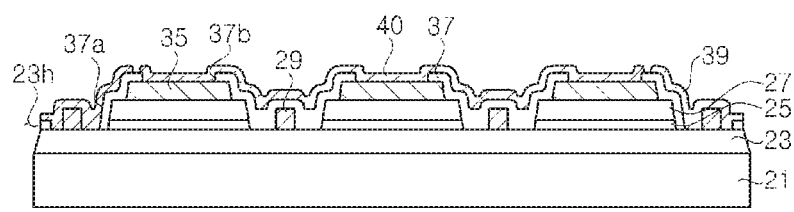

Referring to FIGS. 7A, 7B and 7C, a current distributing layer 39 is formed on or disposed over the lower insulating layer 37. The current distributing layer 39 covers or substantially covers the mesas M and the first conductivity type semiconductor layer 23. In addition, the current distributing layer 39 has a third opening part 39a exposing or partially exposing the second opening parts 37b. The third opening part 39a exposes or partially exposes the second ohmic-contact structures 35 which are exposed or partially exposed by the second opening parts 37b. Therefore, the current distributing layer 39 is insulated from the mesas M and the second ohmic-contact structures 35 by the lower insulating layer 37.

The current distributing layer 39 is electrically connected to the first ohmic-contact structures 29 through the first opening parts 37a of the lower insulating layer 37. The first ohmic-contact structures 29 which are spaced apart from each other can be electrically connected to each other through the current distributing layer 39. Further, the current distributing layer 39 can cover side surfaces of the first ohmic-contact structures 29, and as a result, light incident onto the side surfaces of the first ohmic-contact structures 29 can be reflected from the current distributing layer 39.

As shown in FIGS. 7A, 7B and 7C, since the current distributing layer 39 covers most of the regions on the substrate 21, the current distribution layer 39 has a low resistance, making it possible to easily distribute a current into the first ohmic-contact structures 29.

The current distributing layer 39 can include a metal reflective layer, a diffusion preventing layer, and an oxide preventing layer. Further, the metal reflective layer can be a lowest layer of the current distributing layer 39. The metal reflective layer of the current distributing layer 39 reflects light which is incident onto the current distributing layer 39 to increase reflectivity of the light emitting diode. Al can be used as the metal reflective layer. In addition, the diffusion preventing layer prevents diffusion of metal atom to protect the metal reflective layer in the current distributing layer 39. For example, the diffusion preventing layer in the current distributing layer 39 can prevent the diffusion of metal atom such as Sn in the solder paste. The diffusion preventing layer can include Cr, Ti, Ni, Mo, TiW or W, or a combination of Cr, Ti, Ni, Mo, TiW or W. Mo, TiW, and W can be formed in a single layer. Cr, Ti, and Ni can be formed in a pair. For example, the diffusion preventing layer can include at least two pairs of Ti/Ni or Ti/Cr. The oxide preventing layer can be formed to prevent an oxidation of the diffusion preventing layer and can include Au.

The current distributing layer 39 has an improved reflectivity than other competing current distributing layer that includes the ohmic-contact layer in the lowest layer. Therefore, light loss generated due to light absorption of the current distributing layer 39 can be decreased.

Further, the current distributing layer can include an adhesive layer disposed on the oxide preventing layer. The adhesive layer can include Ti, Cr, Ni, or Ta. The adhesive layer can be used to improve adhesion of the current distributing layer and the upper insulating layer, and can also be omitted.

For example, the current distributing layer 39 can have a multi-layer structure of Al/Ni/Ti/Ni/Ti/Au/Ti.

While the current distributing layer 39 is formed, a diffusion preventing reinforced layer 40 can be formed in the third opening part 39a. The diffusion preventing reinforced layer 40 can be formed of or include the same material and formed by the same process as that of the current distributing layer 39. The diffusion preventing reinforced layer 40 can have the same stacked structure as that of the current distributing layer 39.

The diffusion preventing reinforced layer 40 is spaced apart from the current distributing layer 39 and is connected to the second ohmic-contact structures 35 which are exposed or partially exposed by the second opening parts 37b. The second ohmic-contact structures 35 which are spaced apart from each other by the diffusion preventing reinforced layer 40 can be electrically connected to each other. In addition, as shown in FIG. 7C, the diffusion preventing reinforced layer 40 is insulated from the first ohmic-contact structures 29 by the lower insulating layer 37.

In order to prevent light loss, the current distributing layer 39 and the diffusion preventing reinforced layer 40 can cover 80% or more of a total chip area.

Figure 8A:
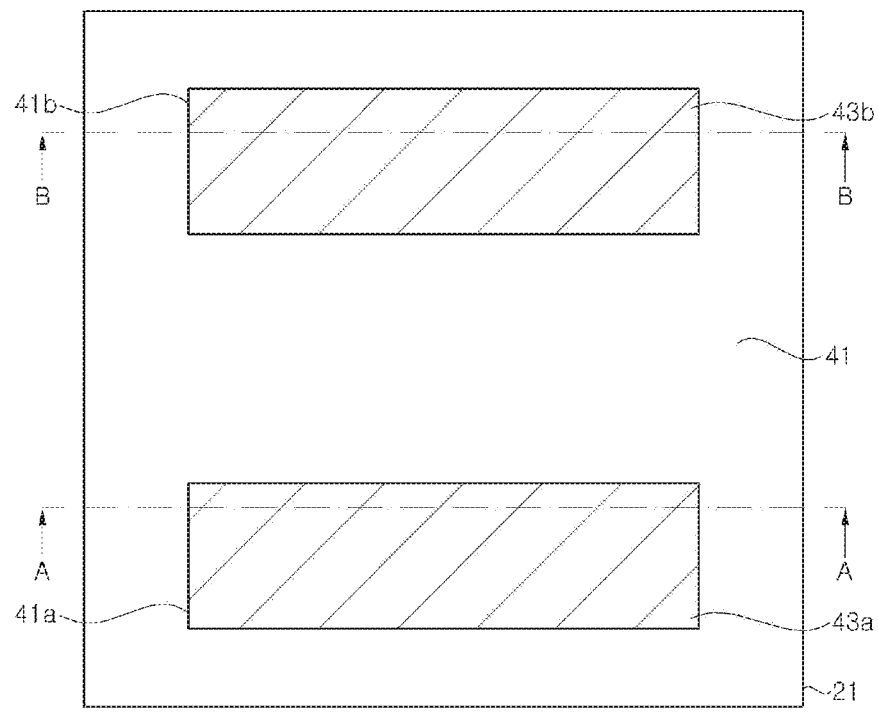
Figure 8B:
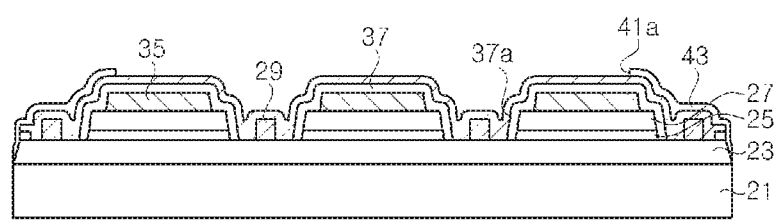
Figure 8C:
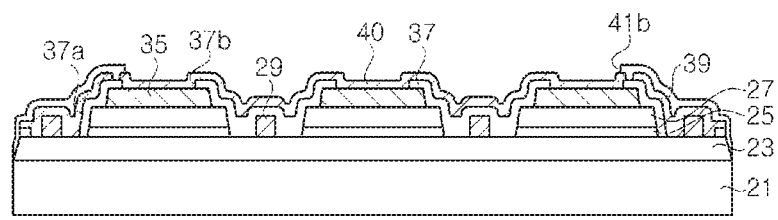
Figure 9A:
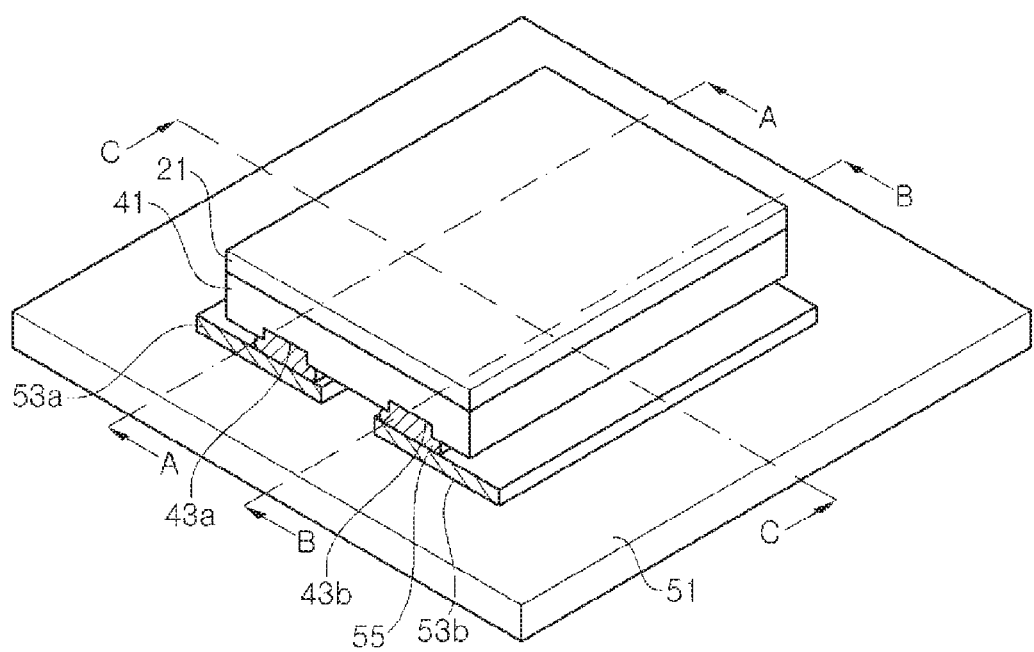
Figure 9B:
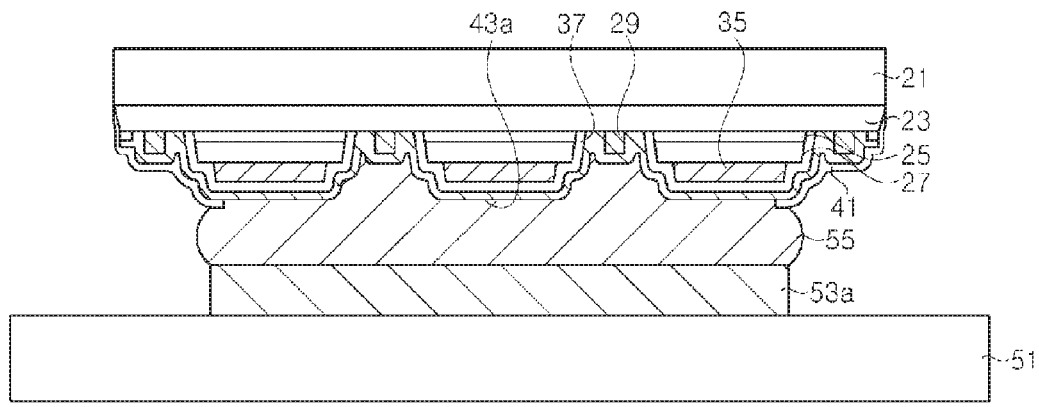
Figure 9C:
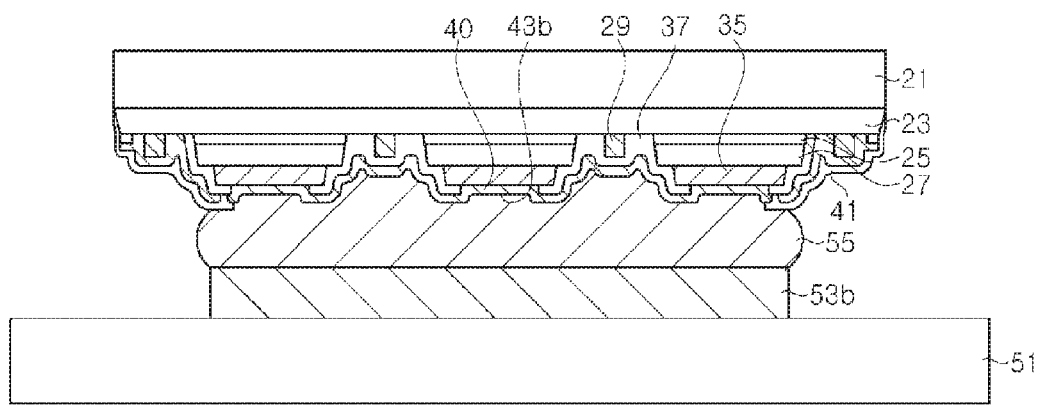
Figure 9D:
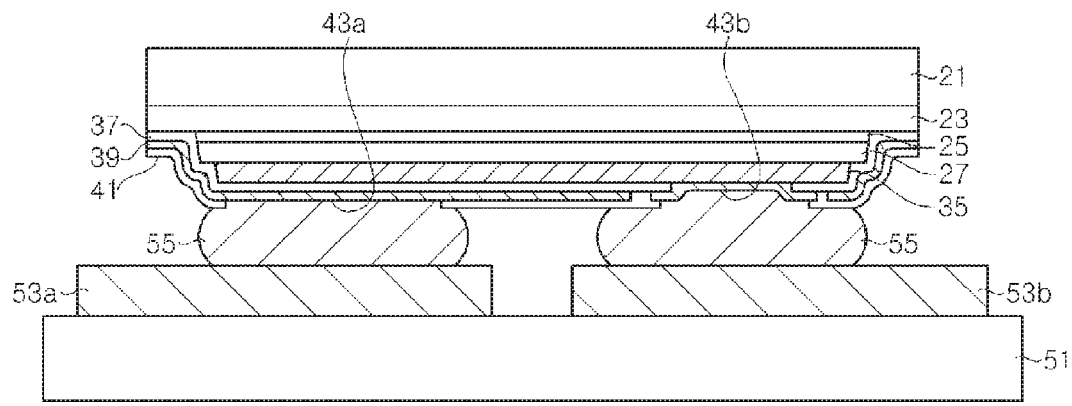

Referring to FIGS. 8A, 8B and 8C, an upper insulating layer 41 is formed on or disposed over the current distributing layer 39. The upper insulating layer 41 has an opening part 41a defining a first pad region 43a by exposing or partially exposing the current distributing layer 39 and an opening part 41b defining a second pad region 43b by exposing or partially exposing the diffusion preventing reinforced layer 40. The opening parts 41a and 41b can have an elongated shape in a direction perpendicular to the mesas M. Meanwhile, the opening part 41b of the upper insulating layer 41 has an area narrower or smaller than the opening part 39a of the current distributing layer 39 and can further have an area narrower or smaller than that of the diffusion preventing reinforced layer 40. Therefore, the upper insulating layer 41 covers a side wall or walls of the third opening part 39a.

In the case in which the diffusion preventing reinforced layer 40 is omitted, the opening part 41b exposes or partially exposes the second opening parts 37b and further exposes or partially exposes the second ohmic-contact structures 35 which are exposed or partially exposed by the second opening parts 37b. In this case, the second ohmic-contact structures 35 can be used as the second pad region.

In addition, the upper insulating layer 41 can also be formed on or disposed over the chip dividing region 23h, covering the side surface or surfaces of the first conductivity type semiconductor layer 23. Therefore, it is possible to prevent substantially prevent permeation of moisture, or the like through upper and lower interfaces of the first conductivity type semiconductor layer.

The upper insulating layer 41 can be formed by a silicon nitride film to prevent metal elements of the solder paste from being diffused, and can be formed to have a thickness of 1 or more to 2 μm or less. In the case in which the thickness of the upper insulating layer 41 is less than 1 μm it is difficult to prevent the diffusion of the metal elements of the solder paste.

Selectively, Sn diffusion preventing plated layers (not shown) can be additionally formed on or disposed over the first electrode pad region 43a and the second electrode pad region 43b using an electroless plating technology such as electroless nickel immersion gold (ENIG).

The first electrode pad region 43a is electrically connected to the first conductivity type semiconductor layer 23 through the current distributing layer 39 and the first ohmic-contact structure 29, and the second electrode pad region 43b is electrically connected to the second conductivity type semiconductor layer 27 through the diffusion preventing reinforced layer 40 and the second ohmic-contact structure 35.

The first electrode pad region 43a and the second electrode pad region 43b can be used to mount the light emitting diode on the printed circuit board, or the like by the solder paste. Therefore, in order to prevent an electrical short circuit between the first electrode pad region 43a and the second electrode pad region 43b due to the solder paste, a distance between the electrode pads can be about 300 μm or more.

Thereafter, the lower surface of the substrate 21 is partially removed by a grinding and/or lapping process, making it possible to reduce a thickness of the substrate 21. The light emitting diodes which are separated from each other, are manufactured by dividing the substrate 21 into a separate chip unit. In this case, the substrate 21 can be divided from the dividing region 23h formed by using the laser scribing technology, and therefore, the laser scribing need not to be additionally performed in order to perform the chip division.

The substrate 21 can be removed from the chip unit of the light emitting diode before or after being divided into a separate light emitting diode chip unit.

Referring back to FIG. 1, the wavelength converter 45 of FIG. 1 can be formed on or disposed over the light emitting diodes 100 which are separated from each other after dicing of wafer. The wavelength converter 45 can be formed using various fabrication processes including by coating a resin containing a fluorescent substance on the light emitting diode using a printing method, or coating fluorescent powder on the substrate 21 using an aerosol spraying apparatus. Since a fluorescent thin film having a uniform thickness can be formed on or disposed over the light emitting diode by using an aerosol deposition method, color uniformity of light emitted from the light emitting diode can be improved. Disposing the wave converter 45 over light emitting diode as described above finishes or completes fabrication of the light emitting diode according to an exemplary embodiment of the present patent document, and the completed light emitting diode is adhered to corresponding pads 53a and 53b of a printed circuit board 51 by a solder paste as shown in FIG. 1, such that a light emitting diode module is finished or completed.

Referring to FIGS. 9A, 9B, 9C and 9D, FIG. 9A shows a schematic perspective view of the light emitting diode module, FIG. 9B shows a cross-sectional view of the light emitting diode module taken along a dash line A-A of FIG. 9A, FIG. 9C shows a cross-sectional view of the light emitting diode module taken along a dash line B-B of FIG. 9A, and FIG. 9D shows a cross-sectional view of the light emitting diode module taken along a dash line C-C of FIG. 9A. Unlike the exemplary embodiment of FIG. 1, the wavelength converter is omitted for illustrative purposes only or merely to enhance the explanation of the present exemplary embodiment of the patent document, but is not limited by the absence of presence of the wavelength converter.

As shown in FIGS. 9A, 9B, 9C and 9D, at least a portion of the solder paste 55 is disposed in the first electrode pad region 43a and the second electrode pad region 43b and is adhered to the corresponding pads 53a and 53b, respectively, of the printed circuit board 51, such that fabrication of the light emitting diode module according to the present patent document can be finished or completed.

According to exemplary embodiments of the present patent document, the first ohmic-contact structure 29 is formed separately from the current distributing layer 39, such that the range of choice of the metal material of the current distributing layer 39 is increased, making it possible to improve light reflectivity of the current distributing layer 39. Further, the light emitting diode (LED) and the LED module having the same capability of preventing diffusion of the metal elements in the solder paste 55 using the current distributing layer 39 and the diffusion preventing reinforced layer can be provided. Further, the light emitting diode having improved current distributing performance, particularly, a flip-chip type light emitting diode can be provided.

Only a few embodiments, implementations and examples are described and other embodiments and implementations, and various enhancements and variations can be made based on what is described and illustrated in this document.

What is claimed is:

1. A light emitting diode module comprising:
a printed circuit board; and
a light emitting diode adhered onto the printed circuit board;
wherein the light emitting diode includes:
a first conductivity type semiconductor layer;
a mesa disposed over the first conductivity type semiconductor layer and including an active layer and a second conductivity type semiconductor layer;
an ohmic-contact structure in contact with the second conductivity type semiconductor layer of the mesa;
a lower insulating layer covering the mesa and the first conductivity type semiconductor layer and disposed to form a first opening pattern having portions at least partially exposing the first conductivity type semiconductor layer and a second opening part exposing the ohmic-contact structure,
the second opening part disposed between portions of the first opening pattern that are positioned along two opposite edges of the light emitting diode;
a current distributing layer electrically connected to the first conductivity type semiconductor layer through the first opening pattern, the current distributing layer disposed to form a third opening part exposing the second opening part;
a diffusion preventing layer disposed in the third opening part of the current distributing layer and electrically connected to the ohmic-contact structure exposed by the second opening part; and
an upper insulating layer covering the current distributing layer,
wherein the upper insulating layer is disposed to form a fourth opening part providing a first electrode pad region and at least partially exposing the current distributing layer and a fifth opening part providing a second electrode pad region and exposing an upper region of the diffusion preventing layer,
wherein the light emitting diode module further includes a first pad and a second pad formed between the printed circuit board and the light emitting diode, the first pad and the second pad respectively adhered to the first electrode pad region and the second electrode pad region by a solder paste.

2. The light emitting diode module of claim 1, wherein the portions of the first opening pattern comprise a first portion and a second portion, the second portion is located closer to an edge of the light emitting diode as compared to the first portion.

3. The light emitting diode module of claim 1, wherein the lower insulating layer has a thickness of 4000 to 12000 Å.

4. The light emitting diode module of claim 1, wherein the lower insulating layer includes a distributed Bragg reflector (DBR).

5. The light emitting diode module of claim 1, wherein current distributing layer and the diffusion preventing layer covers 80% or more of a total area of the light emitting diode.

6. The light emitting diode module of claim 1, wherein the solder paste is diposed between the corresponding pads and the first and the second electrode pad regions.

7. The light emitting diode module of claim 1, wherein the upper insulating layer includes a silicon nitride film which has a thickness between 1 μm and 2 μm.

8. The light emitting diode module of claim 1, wherein the upper insulating layer includes a silicon nitride film to prevent a metal element of the solder paste from being diffused.

9. The light emitting diode module of claim 1, wherein the first electrode pad region and the second electrode pad region are separated from each other by about 300 μm or more.

10. The light emitting diode module of claim 1, further comprising a wavelength converter formed on or disposed over the light emitting diode.

11. The light emitting diode module of claim 1, wherein the lower insulating layer covers a side of the mesa and an edge of the first conductivity type semiconductor layer.

12. A light emitting diode module comprising:
a printed circuit board; and
a light emitting diode adhered onto the printed circuit board;

wherein the light emitting diode includes:
a first conductivity type semiconductor layer;
a mesa disposed over the first conductivity type semiconductor layer and including an active layer and a second conductivity type semiconductor layer;
an ohmic-contact structure in contact with the second conductivity type semiconductor layer of the mesa;
a lower insulating layer covering the mesa and the first conductivity type semiconductor layer and disposed to form a first opening pattern having portions at least partially exposing the first conductivity type semiconductor layer and a second opening part exposing the ohmic-contact structure, the second opening part disposed between the portions of the first opening pattern;
a current distributing layer electrically connected to the first conductivity type semiconductor layer through the first opening pattern, the current distributing layer disposed to form a third opening part exposing the second opening part;
a diffusion preventing layer disposed in the third opening part of the current distributing layer and electrically connected to the ohmic-contact structure exposed by the second opening part; and
an upper insulating layer covering the current distributing layer,
wherein the upper insulating layer is disposed to form a fourth opening part providing a first electrode pad region and at least partially exposing the current distributing layer and a fifth opening part providing a second electrode pad region and exposing an upper region of the diffusion preventing layer,
wherein the light emitting diode module further includes a first pad and a second pad formed between the printed circuit board and the light emitting diode, the first pad and the second pad respectively adhered to the first electrode pad region and the second electrode pad region by a solder paste,
wherein the ohmic-contact structure includes a reflective metal part, a capping metal part, and an oxide preventing metal part, the oxide preventing metal part preventing oxidation of the capping metal part.

13. The light emitting diode module of claim 12, wherin the oxidation preventing metal part comprises Au.

14. The light emitting diode module of claim 13, wherein the oxidation preventing metal part further comprises Ti or Ni and the oxidation preventing metal part directly contacts with the lower insulation layer.

15. A light emitting diode module comprising:
a printed circuit board; and
a light emitting diode adhered onto the printed circuit board;
wherein the light emitting diode includes:
a first conductivity type semiconductor layer;
a mesa disposed over the first conductivity type semiconductor layer and including an active layer and a second conductivity type semiconductor layer;
an ohmic-contact structure in contact with the second conductivity type semiconductor layer of the mesa;
a lower insulating layer covering the mesa and the first conductivity type semiconductor layer and disposed to form a first opening pattern having portions at least partially exposing the first conductivity type semiconductor layer and a second opening part exposing the ohmic-contact structure, the second opening part disposed between the portions of the first opening pattern;
a current distributing layer electrically connected to the first conductivity type semiconductor layer through the first opening pattern, the current distributing layer disposed to form a third opening part exposing the second opening part;
a diffusion preventing layer disposed in the third opening part of the current distributing layer and electrically connected to the ohmic-contact structure exposed by the second opening part; and
an upper insulating layer covering the current distributing layer,
wherein the upper insulating layer is disposed to form a fourth opening part providing a first electrode pad region and at least partially exposing the current distributing layer and a fifth opening part providing a second electrode pad region and exposing an upper region of the diffusion preventing layer,
wherein the light emitting diode module further includes a first pad and a second pad formed between the printed circuit board and the light emitting diode, the first pad and the second pad respectively adhered to the first electrode pad region and the second electrode pad region by a solder paste,
wherein the portions of the first opening pattern comprise sll a first portion and a second portion, the second portion is located closer to an edge of the light emitting diode as compared to the first portion, and
wherein the second portion of the first opening pattern has a length greater than that of the first portion.

16. A light emitting diode module comprising:
a printed circuit board; and
a light emitting diode adhered onto the printed circuit board;
wherein the light emitting diode includes:
a first conductivity type semiconductor layer;
a mesa disposed over the first conductivity type semiconductor layer and including an active layer and a second conductivity type semiconductor layer;
an ohmic-contact structure in contact with the second conductivity type semiconductor layer of the mesa;
a lower insulating layer covering the mesa and the first conductivity type semiconductor layer and disposed to form a first opening pattern having portions at least partially exposing the first conductivity type semiconductor layer and a second opening part exposing the ohmic-contact structure, the second opening part disposed between the portions of the first opening pattern;
a current distributing layer electrically connected to the first conductivity type semiconductor layer through the first opening pattern, the current distributing layer disposed to form a third opening part exposing the second opening part;
a diffusion preventing layer disposed in the third opening part of the current distributing layer and electrically connected to the ohmic-contact structure exposed by the second opening part; and
an upper insulating layer covering the current distributing layer,
wherein the upper insulating layer is disposed to form a fourth opening part providing a first electrode pad region and at least partially exposing the current distributing layer and a fifth opening part providing a second electrode pad region and exposing an upper region of the diffusion preventing layer,
wherein the light emitting diode module further includes a first pad and a second pad formed between the printed circuit board and the light emitting diode, the first pad and the second pad respectively adhered to the first electrode pad region and the second electrode pad region by a solder paste,
wherein the current distributing layer and the diffusion preventing layer have a same structure.

17. The light emitting diode module of claim 16, wherein the current distributing layer and the diffusion layer include a metal reflective layer reflecting incident light thereon.

18. A light emitting diode module comprising:
a printed circuit board; and
a light emitting diode adhered onto the printed circuit board;
wherein the light emitting diode includes:
a first conductivity type semiconductor layer;
a mesa disposed over the first conductivity type semiconductor layer and including an active layer and a second conductivity type semiconductor layer;
an ohmic-contact structure in contact with the second conductivity type semiconductor layer of the mesa;
a lower insulating layer covering the mesa and the first conductivity type semiconductor layer and disposed to form a first opening pattern having portions at least partially exposing the first conductivity type semiconductor layer and a second opening part exposing the ohmic-contact structure, the second opening part disposed between the portions of the first opening pattern;
a current distributing layer electrically connected to the first conductivity type semiconductor layer through the first opening pattern, the current distributing layer disposed to form a third opening part exposing the second opening part;
a diffusion preventing layer disposed in the third opening part of the current distributing layer and electrically connected to the ohmic-contact structure exposed by the second opening part; and
an upper insulating layer covering the current distributing layer,
wherein the upper insulating layer is disposed to form a fourth opening part providing a first electrode pad region and at least partially exposing the current distributing layer and a fifth opening part providing a second electrode pad region and exposing an upper region of the diffusion preventing layer,
wherein the light emitting diode module further includes a first pad and a second pad formed between the printed circuit board and the light emitting diode, the first pad and the second pad respectively adhered to the first electrode pad region and the second electrode pad region by a solder paste,
wherein the solder paste is diposed between the corresponding pads and the first and the second electrode pad regions, and
wherein the solder paste contacts with the current distributing layer and the diffusion preventing layer, and a portion of solder paste contacts with the upper insulating layer.

19. The light emitting diode module of claim 18, wherein the upper insulating layer has a side surface and the portion of solder paste contacts with the side surface.

* * * * *